United States Patent [19]

Glover et al.

[11] Patent Number: 4,720,678
[45] Date of Patent: Jan. 19, 1988

[54] APPARATUS AND METHOD FOR EVENLY DISTRIBUTING EVENTS OVER A PERIODIC PHENOMENON

[75] Inventors: Gary H. Glover, Delafield; Norbert J. Pelc, Wauwatosa, both of Wis.

[73] Assignee: General Electric Company, Waukesha, Wis.

[21] Appl. No.: 905,845

[22] Filed: Sep. 10, 1986

Related U.S. Application Data

[63] Continuation-in-part of Ser. No. 766,733, Aug. 16, 1985, Pat. No. 4,663,591.

[51] Int. Cl.⁴ ............................................. G01R 33/20
[52] U.S. Cl. .................................... 324/309; 324/312; 324/314; 364/150; 382/50
[58] Field of Search ....................... 324/309, 312, 314; 364/150; 382/51, 50; 128/653

[56] References Cited

U.S. PATENT DOCUMENTS

4,663,591  5/1987  Pelc et al. ........................ 128/653 X

OTHER PUBLICATIONS

C. L. Schultz et al., "The Effect of Motion on Two-Dimensional Fourier Transformation Magnetic Resonance Images," Radiology, Jul. 1984, pp. 117–121; vol. 152, No. 1.
D. R. Bailes, et al., "Respiratory Ordered Phase Encoding (ROPE): A Method for Reducing Respiratory Motion Artefacts in MR Imaging." Journal of Computer Assisted Tomography, vol. 9, No. 4, pp. 835–838, Jul.-/Aug. 1985.
B. Vinocur, "Motion-Reduction Software Brightens Outlook for Body MRI", Diagnostic Imaging, pp. 79, 82 and 84, Aug., 1985.
"Digital Radiography", William P. Brody, M.D., Ph.D., Raven Press, 1984, pp. 61–62.

*Primary Examiner*—Tom Noland
*Attorney, Agent, or Firm*—Leydig, Voit & Mayer

[57] ABSTRACT

In a system for reducing artifacts in a desired image due to substantially periodic variations in the imaging signal detected from a portion of an object under examination, a method and apparatus for generating from a signal y(t) related to the variations and whose values are not equally likely, a signal $\phi(t)$ whose values are substantially equally likely for use in distributing events substantially evenly over the variations. In order to provide the signal $\phi(t)$, an apparatus is disclosed for executing the following steps: (a) establishing a historical data base derived from values of the signal y(t) for a period of time preceding the present time, (b) measuring parameters related to the present value of the signal y(t); and (c) producing a value for $\phi(t)$ using the present measured parameters and the historical data base; wherein the values of $\phi(t)$ are more evenly distributed than the values of y(t).

20 Claims, 20 Drawing Figures

APPARATUS AND METHOD FOR EVENLY DISTRIBUTING EVENTS OVER A PERIODIC PHENOMENON

This is a continuation-in-part application of U.S. patent application Ser. No. 766,733, filed Aug. 16, 1985, now U.S. Pat. No. 4,663,591 and it is assigned to the same assignee as that of the present invention.

BACKGROUND OF THE INVENTION

This invention generally relates to estimating in real time the instantaneous phase of a periodic signal. More specifically, this invention relates to an apparatus and method for mapping the relationship between (1) substantially periodic signals corresponding to the motion of a subject under examination in the course of an NMR scan and (2) a signal related to the phase of the motion, wherein the phase information is used in connection with a process for controlling image artifacts caused by the subject motion.

Subject motion during the acquisition of a nuclear magnetic resonance (NMR) image produces both blurring and artifacts. In the most commonly used two-dimensional Fourier transform (2DFT) or spin warp methods the artifacts are typically "ghosts" in the phase-encoded direction. Ghosts are particularly apparent when the motion is periodic, or nearly so. For most physiological motion, including cardiac and respiratory motion, each NMR spin echo or FID can be considered a snapshot view of the object. Blurring and ghosts are due to the inconsistent appearance of the object from view to view.

In projection reconstruction imaging techniques, substantially periodic motion also causes local distortion and blurring, as well as artifacts that extend well away from the moving structure. In these techniques, the artifacts are manifested as streaks rather than ghosts.

Both deleterious effects of periodic motion, blurring and artifacts, can be reduced if the data acquisition is synchronized with the periodic motion. This method is known as gated scanning. Gating can also be used to study the mechanical dynamics of the motion itself, if that is of interest. The drawback of gating is that, depending on the period of the motion, the fraction of the period during which acceptable data can be acquired, and the shortest acceptable pulse sequence repetition time, gating can significantly lengthen the data acquisition time.

While gating is required when the blurring due to the motion is unacceptable and when the motion itself is of interest (e.g., cardiac motion or flow), there are other applications where the loss of detail of the moving structures can be tolerated, but the disturbing effects of the artifacts which can extend far from the moving object cannot be accepted. In such applications, a method that can reduce or eliminate artifacts without the restrictions of gating is needed.

One method for reducing the undesirable effects due to periodic signal variations is disclosed and claimed in commonly assigned U.S. patent application Ser. No. 766, 842, filed Aug. 16, 1985 and U.S. Pat. No. 4,663,591, issued May 5, 1987. According to the method, the time sequence of views which collectively compose a scan is controlled in such a manner that when the views are reordered for construction of an image using Fourier transforms, the motion as seen in the "k-space" of the Fourier transforms is either very slow or very rapid. In the latter approach, the artifacts caused by respiratory motion are moved to the edge of the image where they may be moved out of the displayed field of view. In the former approach, the artifacts are minimally displaced from the moving object portions, thereby virtually eliminating most of the visually appreciable reduction in image quality. In implementing either approach as they are disclosed in the above-mentioned U.S. Pat. No. 4,663,591, substantially instantaneous knowledge of the phase of the respiratory motion is required in order to determine the best sequence of views or view order.

View order selection involves establishing the order in which either the variable amplitude phase-encoding gradient pulses (in the spin-warp method) or the direction of the read-out gradient (in multiple angle projection reconstruction method) are implemented. The view order is chosen so as to make the motion, which would appear to be at a particular frequency (as a function of the phase-encoding amplitude or gradient direction) if the normally used sequential view order was selected, appear to be at another frequency chosen so as to minimize the negative effects of the motion.

In the 2673 (Ser. No. 766,842) application, a view order for a scan is selected before the scan begins. Although this method is effective in reducing artifacts, and is in some respects ideal if the variation in the NMR signal caused by subject motion is rather regular and at a known frequency, the method is not very robust if the assumption made about the motion temporal period does not hold (e.g., because the patient's breathing pattern changes or is irregular). If this occurs, the method loses some of its effectiveness because the focusing of the ghost artifacts, either as close to the object or as far from the object as possible, is less complete.

In the 2916 application, improved results are achieved by abandoning a preselected order and, instead, constructing an order of views in response to the measured motion occurring as the scan is executed. To achieve artifact reduction, a desired relationship between motion phase and phase encoding amplitude is selected. As the scan data are acquired, signals representative of the position of the object are measured and used to select a view order that satisfies the desired relationship between motion phase and phase encoding amplitude. The detailed map between object position and phase encoding amplitude will depend on the fraction of the time that the object spends at each particular position.

For example, the end expiration portion of the respiration cycle is of different relative lengths in different people, and even at different times in the same person. Clearly since data are to be acquired at a regular rate, a larger fraction of the views must be assigned to end expiration in those cases where the end expiration portion of the cycle is longer. In the method of the 2673 application, this is trivial since perfect knowledge of the motion is assumed. In many cases, however, such knowledge cannot be assumed. Also, the motion pattern might vary during the examination.

In order to remove the burden of compensating for the details of the motion pattern, it is desirable to have a method and apparatus that converts the measured motion signal into a new signal, herein referred to as "phase", which the view order selector can use readily. Because the view order selector need no longer worry about the details of the motion pattern, it can very quickly and accurately select the view order for the scan as the scan progresses. Since the respiratory pattern of some subjects is known to vary during the examination, it is also desirable to have a method than can adapt or "learn" as the motion pattern varies. As will be shown, the analog signal generated by conventional respiratory monitors cannot directly be used to quickly and efficiently select the view order.

SUMMARY OF THE INVENTION

Accordingly, it is a principal object of the invention to provide an apparatus and method for determining the approximate instantaneous phase of a substantially periodic signal. In this connection, it is an object of the invention to provide an apparatus and method for generating a signal indicative of phase of the periodic respiratory motion of a subject wherein each point in the generated signal is equally likely such that the view order for the NMR scan can be quickly and efficiently generated as the scan takes place.

It is a further object to provide an apparatus and method for generating such a phase signal wherein the apparatus and method can adapt or "learn" as the characteristics of the motion vary.

Briefly, the invention provides an apparatus and method for converting a periodic signal whose values over a period are not all equally likely to a periodic signal whose values are all equally likely. Much of the artifacts found in an NMR image are attributable to NMR signal variation caused by respiratory motion as previously indicated. The invention converts an unequally likely periodic signal indicative of respiratory motion or the like to an equally likely "phase" signal which is preferably used by the previously mentioned imaging method to evenly distribute the phase encoding values of a scan over the full span of motion positions in a way that minimizes image artifacts.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

Although the invention is not intended to be limited to NMR imaging applications, the preferred embodiment of the invention was developed in connection with NMR imaging, and the invention will be described in detail with reference to a variant of the Fourier transform (FT) technique for NMR imaging, which is frequently referred to as "spin warp". Although specific reference is made hereinbelow to an NMR method for sequencing the amplitude of $G_y$ in each view of a two-dimensional Fourier transform (2DFT) technique, it will be appreciated that the same sequencing method is equivalently applicable to other gradient components when applied for phase-encoding purposes in a three-dimensional Fourier transform technique, or to the direction of the read-out gradient in the projection reconstruction technique.

DETAILED DESCRIPTION OF THE INVENTION

Figure 1:
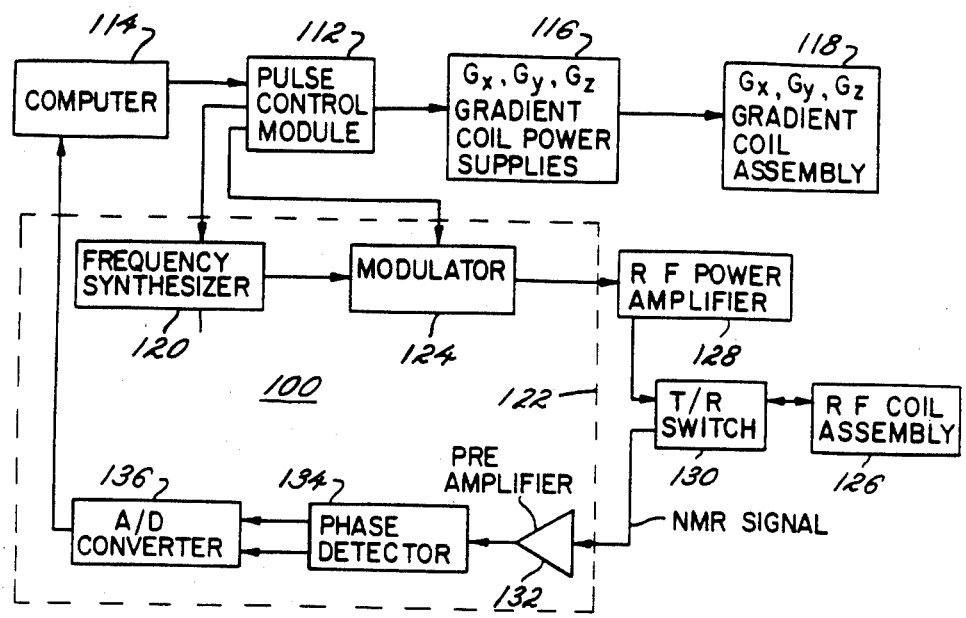
FIG. 1 depicts in block schematic form an exemplary NMR system.

FIG. 1 is a simplified block diagram of an NMR imaging system with respect to which the preferred embodiment of the invention will be disclosed. The system, generally designated 100, includes a pulse control module 112 which provides properly timed pulse waveform signals, under the control of a host computer 114, to magnetic field gradient power supplies collectively designated 116 which energize gradient coils forming part of a gradient coil assembly generally indicated by a block 118. The assembly contains coils which, when energized by the power supplies, produce the $G_x$, $G_y$, and $G_z$ magnetic field gradients (of the magnetic field in the direction of the main magnetic field) directed in the x, y, and z directions, respectively, of the Cartesian coordinate system.

The pulse control module 112 provides activating pulses to an RF synthesizer 120 which is part of an RF transceiver system, portions of which are enclosed by dash-line block 122. The pulse control module 112 also supplies modulating signals to a modulator 124 which modulates the output of the RF frequency synthesizer 120. The modulated RF signals are applied to an RF coil assembly 126 through an RF power amplifier 128 and a transmit/receive switch 130. The RF signals are used to excite nuclear spins in a sample object (not shown) undergoing examination.

The NMR signals from the excited nuclear spins are picked up by the RF coil 126, amplified by the preamplifier 132 and then passed to a quadrature phase detector 134. The detected signals are digitized by A/D converter 136 and applied to computer 114 for processing in a well-known manner to, for example, produce NMR images of the sample.

As used herein, a "view" is a set of NMR measurements made with the same position-encoding gradients. During a scan, a discrete set of the magnetic field gradient values are used to provide spatial information.

Figure 2:
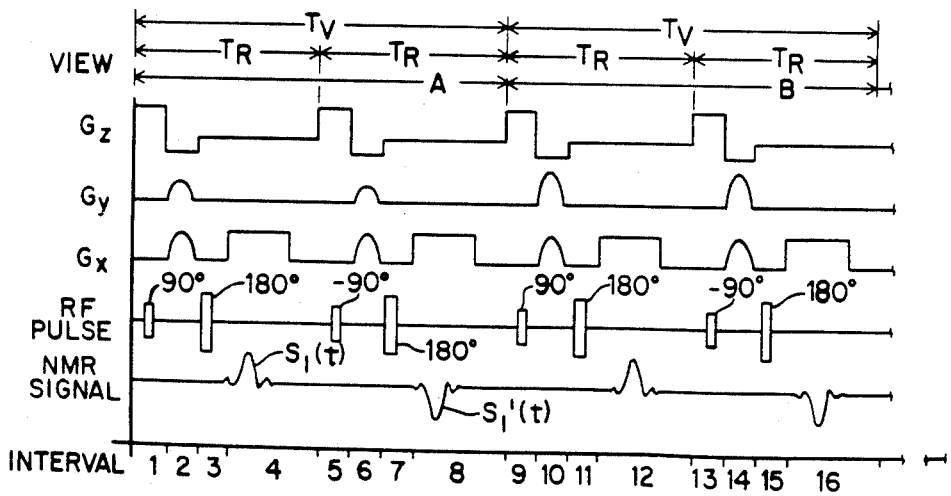
FIG. 2 depicts an exemplary FT imaging pulse sequence of the type known as two-dimensional spin warp.

FIG. 2 depicts two views of what can now be referred to as a conventional imaging pulse sequence of the type known as two-dimensional Fourier transform (2DFT), which is frequently also referred to as two-dimensional "spin warp." This pulse sequence is useful in obtaining, in a well-known manner, imaging data to produce images of a sample being investigated. The pulse sequence utilizes phase-alternated RF excitation pulses which produce phase-alternated NMR signals used to cancel certain baseline errors.

The manner in which this is accomplished in the conventional pulse sequence will now be described with reference to FIG. 2 which depicts two phase-encoding views A and B of a pulse sequence which in practice can contain, for example, 128, 256, or 512 phase-encoding views. Each view is comprised of two NMR experiments. Referring first to View A, there is shown in interval 1 (indicated along the horizontal axis) a selective 90° RF excitation pulse applied in the presence of a positive $G_z$ magnetic field gradient pulse. Pulse control module 112, provides the needed control signals to the frequency synthesizer 120 and modulator 124 so that the resulting excitation pulse is of the correct phase and frequency to excite nuclear spins only in a predetermined region of the sample.

Typically, the excitation pulse can be amplitude modulated by a (sin x)/x function. The frequency of the synthesizer is dependent on the strength of the applied magnetic field and the NMR species being imaged in accordance with the well-known Larmor equation. The pulse control module 112 also applies activating signals to the gradient power supplies 116 to generate, in this case, the $G_z$ gradient pulse.

In interval 2, $G_x$, $G_y$ and $G_z$ gradient pulses are applied simultaneously. The $G_z$ gradient is a rephasing pulse typically selected such that the time integral of the gradient waveform over interval 2 is approximately equal to $-\frac{1}{2}$ of the the time integral of the gradient waveform over interval 1. The function of the negative $G_z$ pulse is to rephase the nuclear spins excited in interval 1.

In order to encode spatial information in the y direction, the $G_y$ gradient pulse is a phase-encoding pulse selected to have a different amplitude in each view of a scan (e.g., Views A, B, ..., etc.). The number of different $G_y$ gradient amplitudes is typically selected to equal at least the number of pixel resolution elements the reconstructed image will have in the phase-encoding (Y) direction. Typically, 128, 256 or 512 different gradient amplitudes are selected.

The $G_x$ gradient pulse in interval 2 is a dephasing pulse needed to dephase the excited nuclear spins by a predetermined amount to delay the time of occurrence of a spin-echo signal $S_1(t)$ in interval 4. The spin echo is produced typically with the application of a 180° RF pulse in interval 3. The 180° RF pulse is a time-reversal pulse which reverses the direction of spin dephasing so as to produce the spin-echo signal. The spin-echo signal is sampled in interval 4 in the presence of a linear $G_x$ gradient pulse to encode spatial information in the direction of this gradient.

In the illustrated pulse sequence, baseline error components are eliminated by using a second NMR experiment as part of each view. This second experiment is substantially identical to the first with the exception that the RF excitation pulse in interval 5 of View A is selected to be 180° out of phase (as suggested by the minus sign) relative to the excitation pulse in interval 1 of View A, so that the resulting spin-echo signal $S_1'(t)$ in interval 8 is 180° out of phase with the spin-echo signal $S_1(t)$ in interval 4. If the signal $S_1'(t)$ is subtracted from $S_1(t)$, only those components of the signals with reversed sign in the signal $S_1'(t)$ are retained. The baseline error components cancel.

In order to provide a full scan from which an image can be constructed, the process described above with reference to View A is repeated for View B and so on for all amplitudes of the phase-encoding $G_y$ gradient.

Figure 3:
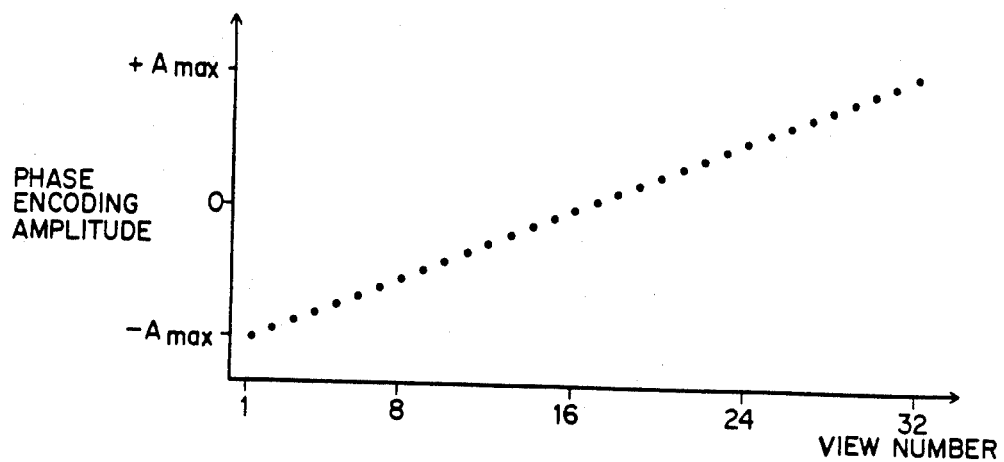
FIG. 3 illustrates a conventional sequence for incrementing the amplitude of the phase-encoding gradient in a pulse sequence such as the one shown in FIG. 2.

Conventionally, the amplitude of the $G_y$ phase-encoding gradient in sequential views is incremented monotonically, as suggested by the exemplary sequence described with reference to FIG. 2. In FIG. 3, the relationship between the amplitude of $G_y$ and the conventional sequence of views is graphically illustrated. Each dot represents one $G_y$ gradient amplitude. Although a typical scan usually has 128 views, for simplicity a 32-view scan is illustrated. In view 1, the $G_y$ gradient is selected to have a predetermined negative amplitude ($-A_{max}$). The amplitude of the gradient increases monotonically through a value of near 0 at view 16 and further increases monotonically to a positive amplitude ($+A_{max}$) at view 32.

As alluded to hereinabove, it has been found that quasi-periodic motion of the subject (e.g., respiratory motion) when using the phase-encoding amplitude sequence of FIG. 3, leads to structured artifacts (manifested in reconstructed images as ghost images displaced from the moving structures in the phase-encoded direction) and loss of resolution. The primary source of these artifacts has been determined to be motion-induced phase and amplitude errors which cause inconsistencies in the phase-encoding direction when using FT imaging techniques. Specifically, to the extent that the motion is a periodic function of phase-encoding, the artifact will appear as discrete ghost or ghosts, replicating some of the features of the moving object.

Digressing briefly, a simple way to understand motion-induced artifacts in FT imaging is not by dealing with motion directly, but by considering a small volume fixed in space whose NMR signal is a function of time. This small volume will be referred to herein as a pixel even though it is actually a region in space. In the presence of respiratory motion, a temporal variation in brightness may be due to material moving into and out of the pixel. Inplane motion causes brightness to increase in one pixel while it decreases in another. Regardless of motion direction, due to the linearity of the imaging process, each pixel can be treated independently. Further, since each view can be assumed to be an instant snapshot, only the column in the image in the phase-encoding direction containing the pixel of interest need be considered.

Thus, assume the object, o, to be imaged is only a function of one dimension (the phase-encoded direction, e.g., y), that only a single point at $y_o$ has any intensity, and for now, assume it has constant brightness $B_o$. Then, the object, o, is defined by, $$o(y) = B_o \delta(y - y_o), \quad (1)$$

where $\delta$ is a Dirac delta function.

The measurements made in an FT imaging method form the Fourier transform of object o:

$$O(k_y) = F[o(y)] = B_o e^{-2\pi i k_y y_o}, \quad (2)$$

where $k_y$ is a spatial frequency in the y direction, which, for 2DFT imaging, is proportional to the area under the phase-encoding gradient pulse. If variations in the brightness of the object are now allowed and if when the measurement at $k_y$ is made the pixel brightness is $B_o + B(k_y)$, where $B_o$ is the average value and B is the time varying portion, then the measured signal $H(k_y)$ is:

$$H(k_y) = [B_o + B(k_y)]e^{-2\pi i k_y y_o}, \quad (3)$$

$$= B_o e^{-2\pi i k_y y_o} + B(k_y)e^{-2\pi i k_y y_o}, \quad (4)$$

Note that the error term, the second term on the right-hand side, is the Fourier transform of the single point at $y_o$ modulated by the brightness variation $B(k_y)$.

The image h(y) of the object is derived by taking the inverse Fourier transform of H:

$$h(y) = F^{-1}\{B_o e^{-2\pi i k_y y_o}\} + F^{-1}\{B(k_y)e^{-2\pi i k_y y_o}\}, \quad (5)$$

The first term on the right-hand side is the desired image, an object at point of $y_o$ with brightness $B_o$. Use of the convolution theorem on the second term results in:

$$h(y) = B_o \delta(y - y_o) + \delta(y - y_o) * g(y), \quad (6)$$

where g(y) is the ghost kernel which is equal to the inverse Fourier transform of the temporal variation of the brightness amplitude with respect to $k_y$ (which is proportional to the phase-encoding amplitude):

$$g(y) = F^{-1}\{[B(k_y)]\}, \quad (7)$$

The first term on the right-hand side of Equation (6) describes motion blurring. As the object, o, moves, each point in the image through which the object passes will receive a contribution proportional to the amount of time the object spent at that point throughout the scan. The second term in Equation (6) shows that whatever temporal variations there are at a point will produce ghosts. The ghosts emanate in the phase-encoding direction from the source. The details of the ghosts depend on the frequency content of the temporal variations.

Figure 4:
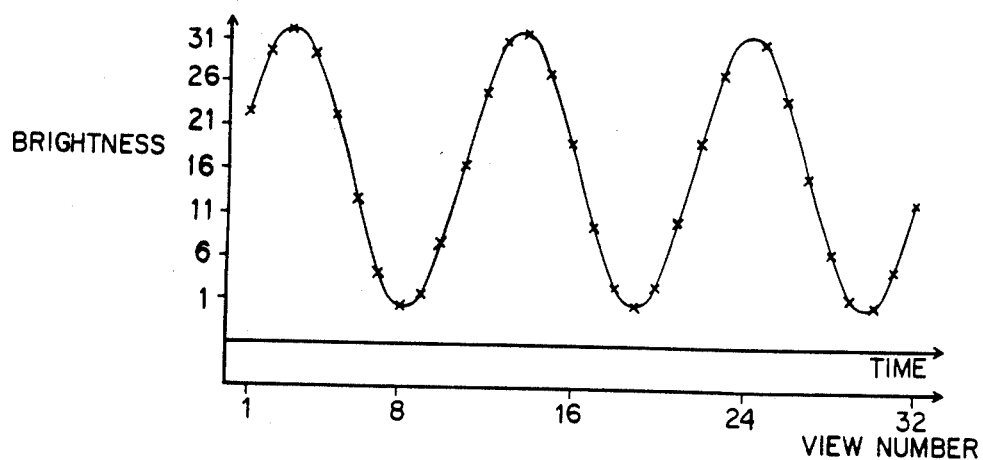
FIG. 4 depicts object brightness versus time for an object whose amplitude is varying sinusoidally as a function of time.

Suppose, firstly, that the brightness variation function $B(k_y)$ is a sinusoid as illustrated by the exemplary plot of the object brightness (vertical axis) versus time in FIG. 4. Also shown in FIG. 4 as a set of points designated by "X" marks is the object brightness at each of the 32 discrete times at which a view measurement is taken. In practice, this brightness variation function may have many cycles during one scan; e.g., 10-20 or more, depending on, for example, the respiration rate of the subject being imaged. For simplicity, FIG. 4 depicts only three cycles. The function $B(k_y)$ may be expressed as:

$$B(k_y) = \Delta B \sin(2\pi f^* k_y + \phi), \quad (8)$$

where f* is the frequency in brightness cycles per spatial frequency ($k_y$) increment. To make this more intuitive, the frequency f* may be converted to brightness cycles per scan. Assume there are N views in a scan and that the field of view is FOV so that the spatial frequency increment per view is 1/FOV. Then the brightness frequency in units of cycles per scan may be expressed as:

$$f = f^*(1/FOV)N, \quad (9)$$

Using Equation (9) for the sine wave of Equation (8) and substituting into Equation (7), the ghost kernel g(y) becomes:

$$g(y) = (\Delta B/2)[\sin(\phi) + i \cos(\phi)]\delta(y - f FOV/N) + (\Delta B/2)[\sin(\phi) - i \cos(\phi)]\delta(y + f FOV/N), \quad (10)$$

Thus, the ghost kernel for a simple sinusoidal brightness variation as illustrated in FIG. 4 causes there to be two ghosts emanating from the source pixel. The first term in Equation (10) produces a ghost above the source pixel while the second term produces a ghost below the source pixel. It will be recognized that in an actual image, many points in the image may be producing ghosts.

Figure 5:
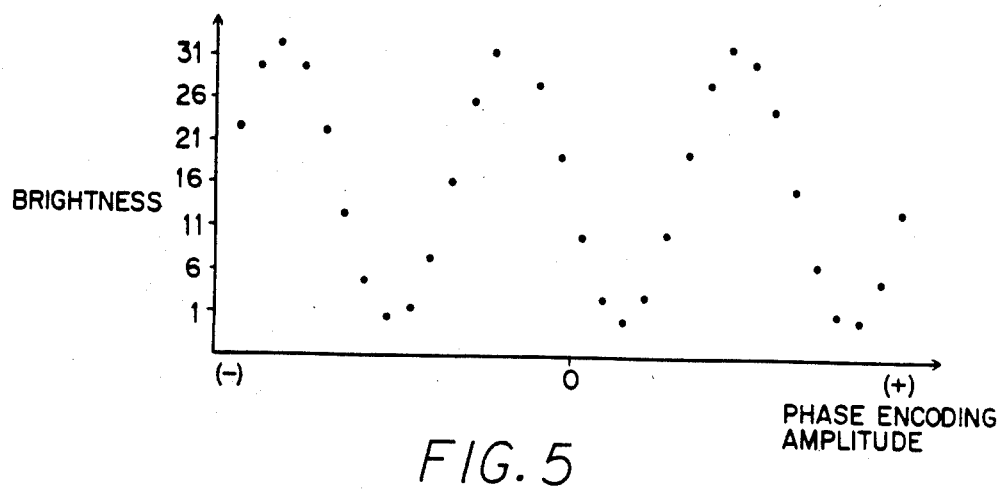
FIG. 5 depicts object brightness versus phase-encoding amplitude for a scan in which the amplitude of the phase-encoding gradient is implemented monotonically in the manner illustrated in FIG. 3.

For the simple 32-view example shown in FIG. 3, if the typical monotonic phase-encoding order is applied, the relationship between source brightness and phase-encoding amplitude is as shown in FIG. 5. Each point in FIG. 5 is generated by finding, for each view, the brightness value in FIG. 4 and the corresponding phase-encoding amplitude in FIG. 3. The location of the ghosts in an image is determined by the frequency content of the relationship between brightness and phase-encoding amplitude as exemplified by the plot in FIG. 5.

In order to reduce the effect of the motion in the final image, the ghosts created in the 2DFT technique are moved to be either as close as possible to the moving structures, or as distant as possible to those structures. In the latter approach, the ghost is ideally moved outside the area of interest so that it is entirely eliminated from the desired image. Because the frequency content of the signal variation as a function of phase encoding determines the location of the ghost in the image, a method has been developed to either maximize or minimize the frequencies that contain most of the energy. According to the method, the order in which the amplitudes of the gradient $G_y$ are implemented is selected so that, after the measured data are reordered in a monotonic order of the phase encoding, the apparent frequency of the brightness variation is changed; specifically, the frequency has been either maximized or minimized. The approach which minimizes the frequencies of brightness variation caused by respiratory motion is commonly referred to as the "low frequency sort mode", and the approach that maximizes the frequencies is referred to as the "high frequency sort mode".

In order to control the occurrence of artifacts in an image created by the brightness variation caused by motion, a parameter representative of the position of the object is needed. One possible parameter is the relative phase within the motion cycle. This position defining parameter will be referred to as "motion phase," although it may not be phase in a rigorous sense.

Figure 6:
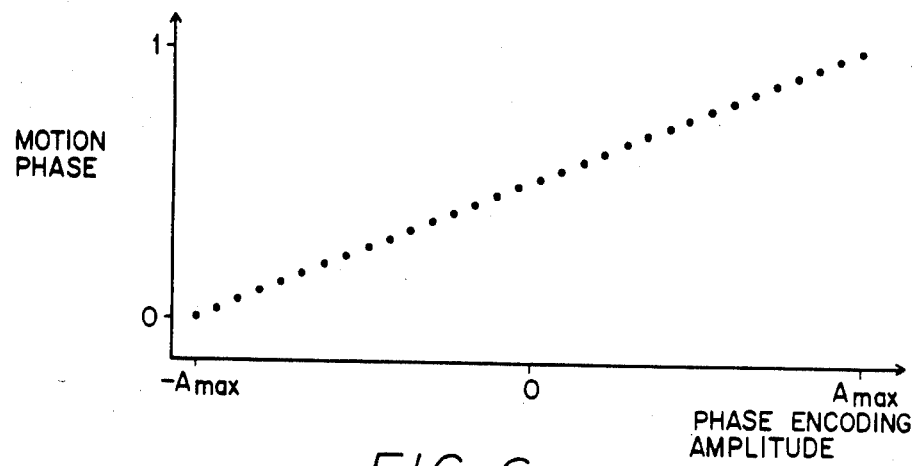
FIG. 6 illustrates the desired relationship between motion phase and phase-encoding amplitude for implementing a low frequency sort method for minimizing the spatial displacement of ghosting artifacts from the main image.
Figure 7:
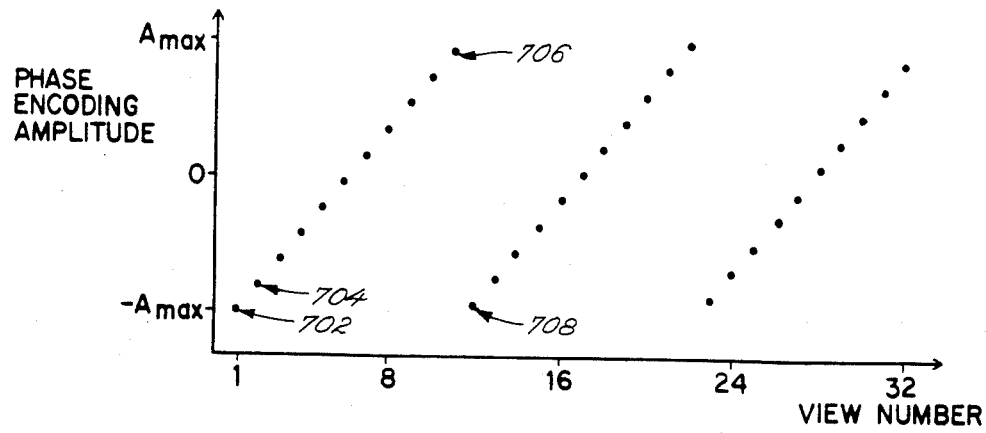
FIG. 7 depicts phase-encoding amplitude for each view in accordance with the low frequency sort method.

The objective of the low frequency sort mode is to implement a view order so that after the measurement data acquired in each view are reordered, the motion will appear to go through only one cycle or less. This can be achieved if, for example, as a result of the view order selected, motion phase is monotonically related to phase-encoding amplitude as is shown in FIG. 6 for the 32-view example. The relationship of FIG. 6 can be approximated if the view order of FIG. 7 is used for the signal variations illustrated in FIG. 4. FIG. 7 shows the temporal order in which the phase-encoding amplitudes are applied.

Figure 8:
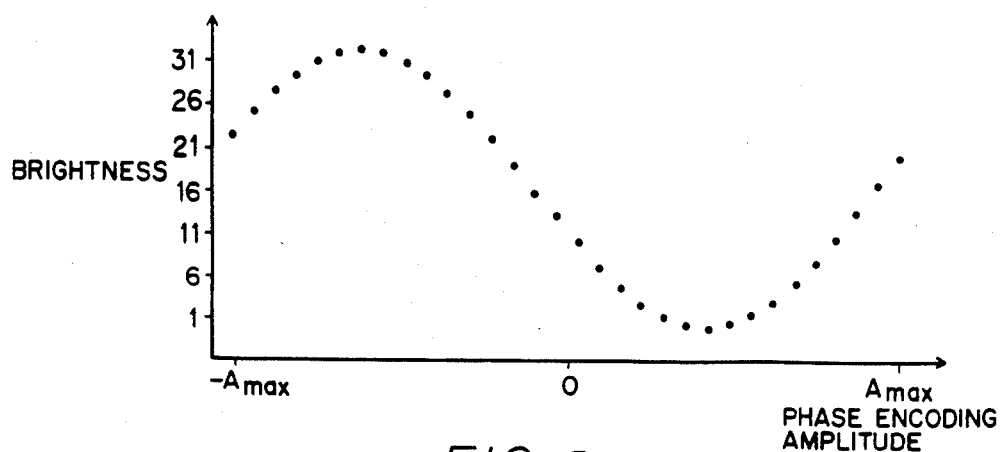
FIG. 8 shows object brightness as a function of phase-encoding amplitude for the low frequency method of FIGS. 6 and 7.

Prior to constructing the image (i.e., taking the inverse Fourier transform in the 2DFT method), the measured data gathered using the view order of FIG. 7 must be reordered into monotonically, increasing order of phase-encoding gradient amplitude. When this reordering is done, the brightness variation versus phase-encoding amplitude is as shown in FIG. 8. Whereas the brightness varied at a rate of 3 cycles per scan (FIG. 5) when a conventional montonic phase-encoding order (FIG. 5) was used, the view order of FIG. 7 changes the apparent frequency of the variation to one cycle per scan (FIG. 8). As a result of making the motion appear to cover only one cycle during the scan, the ghosts are made to appear closer to the moving structures. Accordingly, structures far from moving objects are undisturbed.

In the "high frequency sort mode", a phase-encoding gradient sequence is selected so that, after the data acquired with the various phase-encoding gradient amplitudes are reordered prior to image construction, the motion appears to be at the highest possible frequency.

Figure 9:
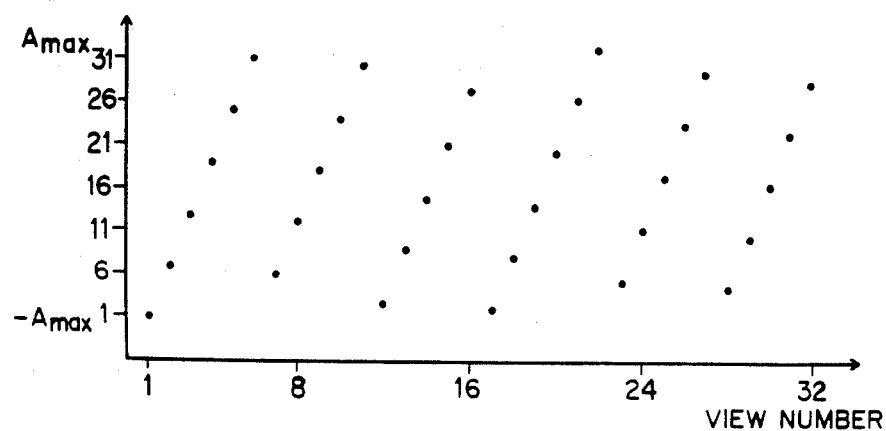
FIG. 9 depicts the sequential order of phase-encoding amplitudes for a high frequency sort method wherein the spatial displacement of ghosting artifacts is maximized.
Figure 10:
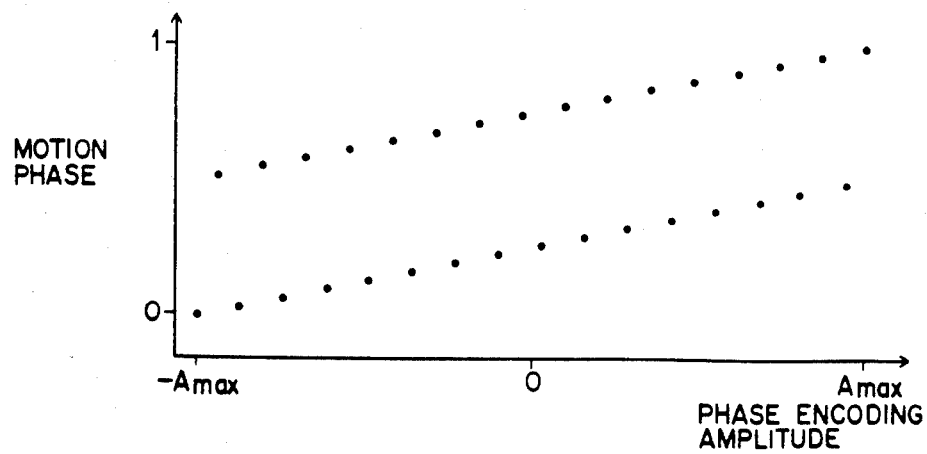
FIG. 10 shows the relationship between motion phase and phase-encoding amplitude for the high frequency sort mode embodiment of a prior method.
Figure 11:
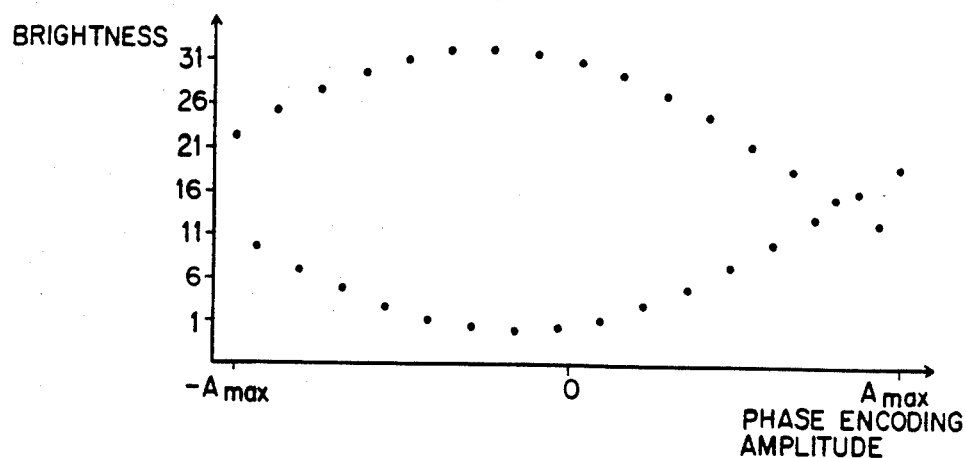
FIG. 11 shows the relationship between object brightness and phase-encoding amplitude for the high frequency sort method.

One relationship between motion phase and phase encoding amplitude that makes the motion appear to be at the highest frequency is shown in FIG. 10. It can be appreciated from FIG. 10 that the brightness of the object will appear to vary by approximately one-half cycle between adjacent phase-encoding values. One sequence of phase encoding amplitudes (i.e. view order) that makes the reordered scan data represent a rapidly moving object is illustrated in FIG. 9. When the view order of FIG. 9 is combined with the brightness as a function of time as shown in FIG. 4, the relationship between brightness and phase-encoding illustrated in FIG. 11 results therefrom. Because FIG. 11 has primarily high frequency components, the ghosts will be displaced as far as possible (FOV/2) from the main image.

Figure 12:
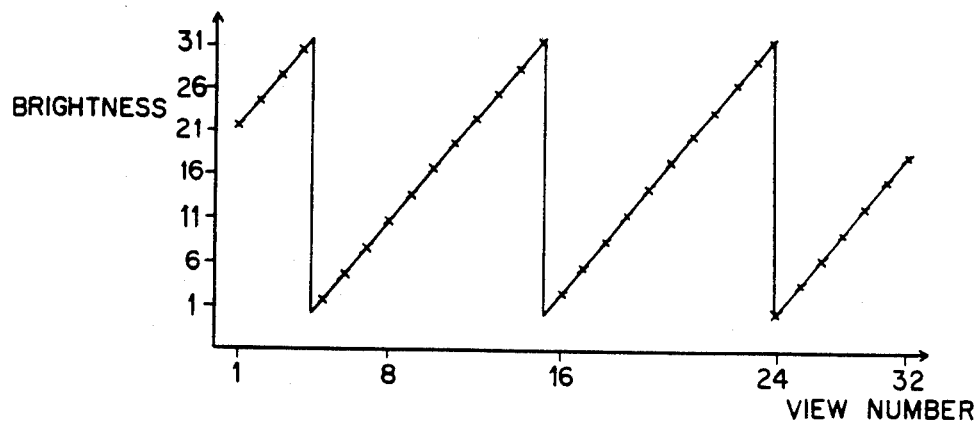
FIG. 12 illustrates several cycles of object brightness and having less symmetry than the waveform depicted in FIG. 4.
Figure 13:
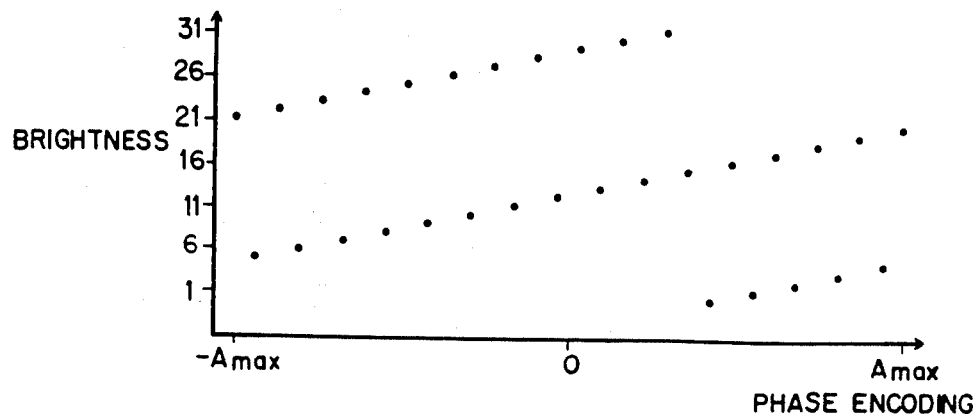
FIG. 13 shows the relationship between object brightness and phase-encoding amplitude for object brightness variation pattern depicted in FIG. 12.
Figure 14:
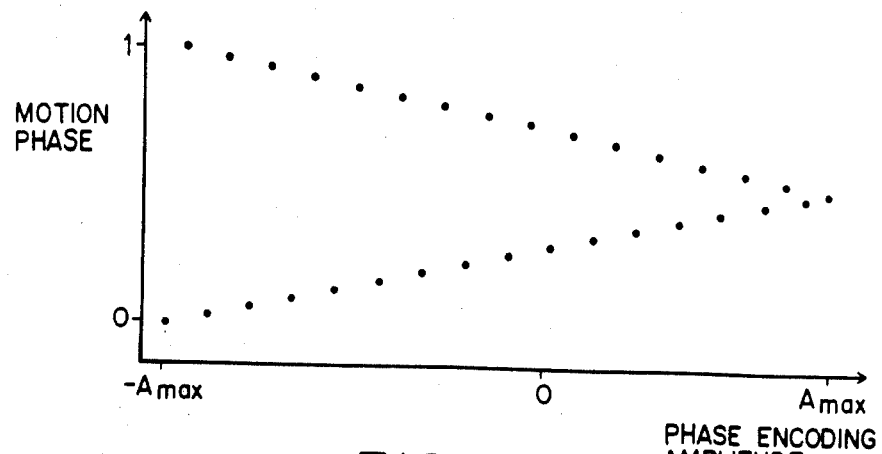
FIG. 14 shows the relationship between motion phase and phase-encoding amplitude for another approach to the high frequency sort method.
Figure 15:
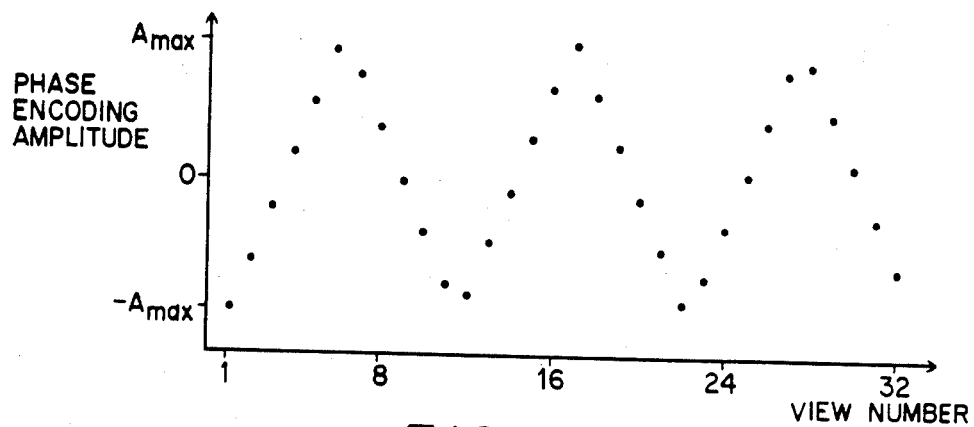
FIG. 15 depicts phase-encoding amplitude versus view number for the high frequency sort method of FIG. 14.
Figure 16:
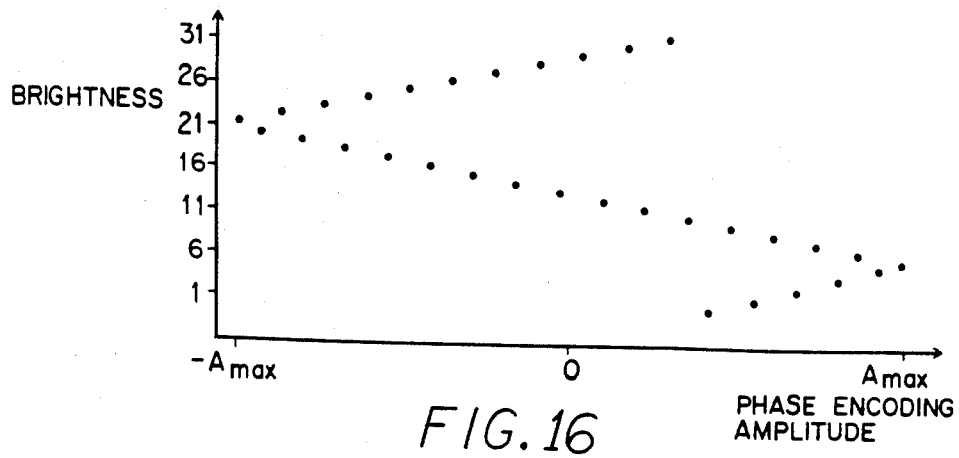
FIG. 16 shows a plot of brightness versus phase-encoding amplitude for the high frequency sort method of FIG. 14.

For a brightness variation pattern that has less symmetry than the exemplary sinusoidal pattern in FIG. 4, the brightness as a function of phase encoding achieved by the high frequency sort relationship of FIG. 10 would still contain some low frequency content. For example, if the sine wave of FIG. 4 were replaced by the sawtooth of FIG. 12, the resulting relationship between brightness and phase encoding would be that shown in FIG. 13. Residual low frequency components can be seen in FIG. 13 as a slow upward trend from left to right. While the strong high frequency components in FIG. 13 indicate that much of the ghost energy will be displaced far from the source pixel, the residual low frequency components will cause there to be some residual effects near the source pixel, although less than in a low frequency sort. This performance can be further improved by using the relationship between motion phase and phase encoding as shown in FIG. 14. The relationship of FIG. 14 can be approximated if the view order of FIG. 15 is used. If FIG. 15 is combined with the sawtooth variation of FIG. 12 the result will be FIG. 16 which shows decreased residual low frequency content. As a result, the neighborhood of the source pixel will be less contaminated with ghosts.

Selection of the sort mode (e.g., high frequency sort or low frequency sort) and the number of views or phase-encoding gradient amplitude values to be used in the scan defines the desired relationship between motion phase and phase-encoding amplitude. For example, FIGS. 6, 10 and 14 show three possible relationships for the 32-view case.

From the foregoing it can be appreciated that one key to the successful reduction of motion-induced artifacts is the proper choice of the order in which the phase-encoding gradient amplitudes are used. The method for ordering the sequence of views disclosed in the 2673 application, relies on substantial, almost complete, a-priori knowledge of the motion pattern. This knowledge is used, along with the time between temporally sequential views (the view increment time selected by the operator or pre-set) to select a view order prior to acquisition of the scan data.

In the 2673 application, the known view increment time and the assumed motion pattern are used to calculate the relative motion phase at the time each view of the scan is acquired. Using various sorting schemes, a unique phase-encoding amplitude is assigned to each view in a manner to cause the desired relationship between relative motion phase and phase encoding to be satisfied as well as is possible. This approach is ideal if the signal variations are indeed as assumed. However, if the period of the signal variations differ from the assumed value or varies during the scan the efficiency of the artifact reduction will be diminished.

In order to overcome this deficiency, the 2916 application discloses the selection of a phase-encoding gradient amplitude for each view (in either the low-frequency sort mode or the high-frequency sort mode) just prior to the start of the pulse sequence for that view wherein the selection depends on the phase of the signal variation at that point in time. Thus, the final view order (i.e., the temporal order in which the phase-encoding amplitudes are implemented) depends on the measured phase during the scan. In this manner, immunity from the effects of variation in the motion pattern is obtained.

The view orders shown in FIGS. 7, 9 and 15 were generated using the methods of the aforementioned patent application (15-NM-2673) which rely on a presumptive knowledge of the motion period. The view orders that would be generated by a view-by-view determination of the phase-encoding amplitude would be somewhat different.

Figure 17:
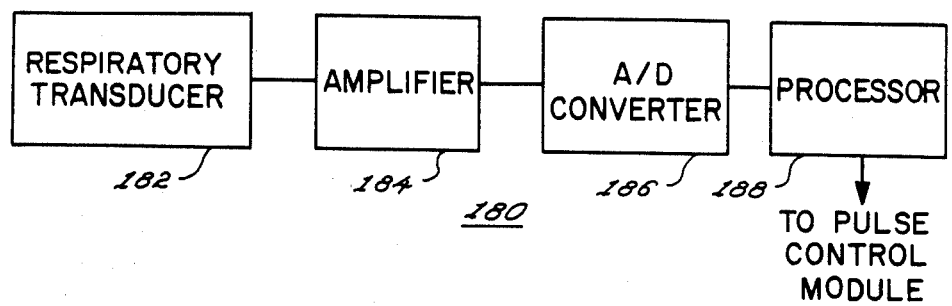
FIG. 17 depicts in block schematic form an exemplary system for supplying respiratory phase values in accordance with the invention.

In the view-by-view approach, it is important that real-time motion phase information be available during the entire scan. Since one important application of the high or low-frequency sort mode relates to reduction of ghost artifacts due to patient motion caused by respiration, a respiration monitoring system such as illustrated in FIG. 17 is required to provide this information.

The system 180 is composed of a respiratory transducer 182 which conveniently may be a pneumatic bellows with a pressure sensor for providing an electrical output signal to an amplifier 184 in response to pressure changes in the bellows. The amplified signal is digitized in an analog-to-digital (A/D) converter 186 and applied to processor 188 which calculates the needed phase values. The phase value computed by the processor is applied to PCM 112 (FIG. 1) which selects the order in which the amplitudes of the phase-encoding gradient are applied as the scan data are acquired. The PCM supplies the computer 110 with the resulting view order for image construction purposes.

Figure 18:
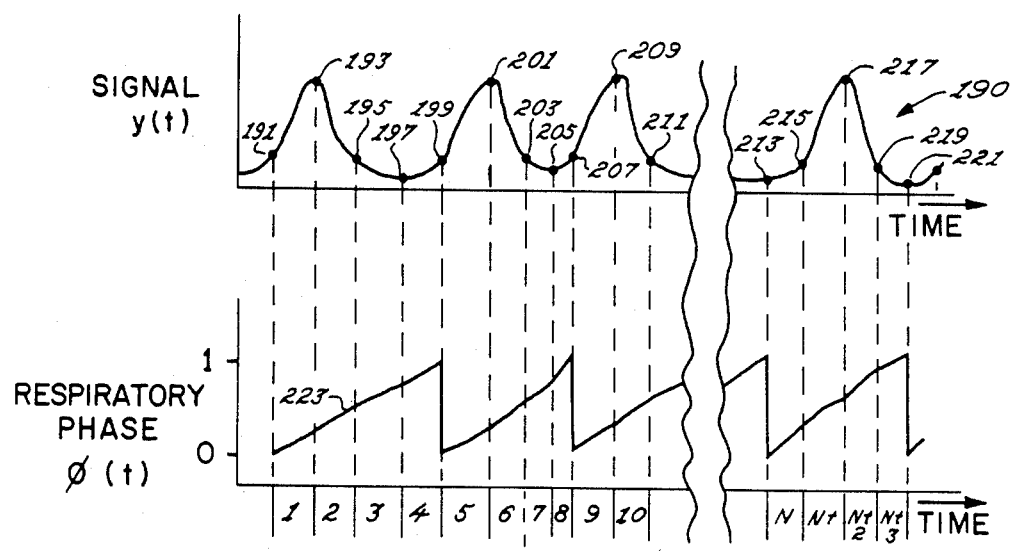
FIG. 18 illustrates plots as a function of time of a representative respiratory waveform and a representative corresponding phase signal according to a first alternative embodiment of the invention.

FIG. 18 shows a plot of a representative respiratory cycle curve 190 showing the signal y(t) that might be measured using a respiration monitor as a function of time. Four breath cycles are shown in curve 190. Signal peaks 193, 201, 209 and 217 correspond to peak inspiration when the lungs are expanded while the shallow plateaus of low signal level between the peaks correspond to end expiration.

Prior to the initiation of a scan, the desired relationship between motion phase and phase-encoding amplitude is tabulated. Thus, the table contains an entry for each of a finite set of values of respiratory phase, each entry containing the desired phase-encoding amplitude value corresponding to a particular respiratory phase.

Immediately before the start of the pulse sequence for the first view, a reading of the motion phase produced by the respiration monitoring system 180 is taken by the pulse control module 112. In general, the measured motion phase may not be equal to one of the finite set of motion phase values used to construct the table. If the actual measured value equals one of the values of the table, the corresponding phase-encoding value is selected for the current view. If an equal value cannot be found, the entry whose motion phase is closest to the measured motion phase is selected. In either case, a phase-encoding amplitude value is selected and implemented in the pulse sequence of the current view. The selected table entry is then removed from consideration for the remaining views of the scan.

Immediately prior to the beginning of the pulse sequence for the next view, another motion phase reading is taken from the respiration monitoring system 180, a phase-encoding value is selected from those values remaining in the table by choosing the value whose corresponding ideal motion phase is closest to the actual motion phase and the corresponding table entry is deleted from further consideration. The process continues in this way until all views (and all phase-encoding amplitudes) are taken. As the views are acquired, the sequence in which the phase-encoding amplitudes were used is memorized since the scan data must be reordered prior to or as part of the image construction calculations. Also, for each view the difference between the ideal motion phase for the selected phase-encoding amplitude and the actual measured motion phase may be recorded.

For optimum operation of the method described above wherein the phase-encoding amplitude is determined just prior to each view, the map from measured motion phase to phase encoding amplitude should be such that, averaged throughout the scan, the probability of being selected is the same for all phase encoding values. If this is so, then as the scan progresses it is likely that a table entry with an ideal motion phase quite close to the measured motion phase will still be available, and the desired relationship between motion phase and phase encoding will be well approximated. If all phase encoding values are not equally likely to be selected, then, early in the scan, a good match between the measured and ideal phases will be found. However, toward the end of the scan the available phase encoding values will primarily be those which were less likely to be selected, and, since these are not well matched to the measured motion phases, relatively larger discrepancies between ideal and measured motion phases will have to be accepted. As a result, the desired preselected relationship between motion phase and phase encoding will be less well approximated.

The problem of mapping the motion characteristics to the phase encoding values may be conveniently solved by first assuming that all motion phase values will be equally likely (i.e. uniform distribution of motion phase values between a minimum and a maximum value) and defining the relationship between motion phase and phase encoding amplitude accordingly. The relationships of FIGS. 6, 10, and 14 were so selected. Secondly, the measured motion amplitudes, i.e. the signals from the transducer, are converted to motion phase values in a way that insures that the resulting motion phase values are, on the average, uniformly distributed.

In accordance with the invention, a motion phase signal $\phi$ is derived from the respiratory signal y(t), wherein the signal $\phi$ is indicative of the motion of the object being imaged and is characterized by its properties that all values of $\phi$ are equally likely. In one approach to achieving a motion phase signal, a set of fiducial points are identified in a breathing cycle of a subject to be imaged. These fiducial points provide a basis for constructing a motion phase signal $\phi(t)$ having the desired characteristic of all values being equally likely. In a second, alternative approach, an equally-likely phase relationship is defined by the phase of the sine wave function which best fits previously collected respiratory data. The phase of the selected sine wave is utilized as the motion phase signal $\phi(t)$ for the next pulse sequence. In a third and preferred, alternative approach, a transfer function $\phi(y)$ is constructed from respiratory data collected from several preceding breathing cycles and it is applied to the real time y(t) signal in order to generate a motion phase signal characterized by all phase values being equally likely even though the values of the respiratory signal y(t) do not share that characteristic.

In the first alternative approach, a breathing-cycle template is constructed from baseline values of the signal y(t) that are acquired from several exemplary respiratory cycles. Each breathing cycle is divided into some number (greater than or equal to one) of subintervals or segments. In an illustration of this approach in FIG. 18, each breathing cycle is marked by four fiducial points so the cycle is broken into four time intervals. For example, the first breathing cycle indicated by the signal y(t)

is described by the fiducial points 191, 193, 195 and 197. Fiducial point 199 marks the beginning of the next cycle. The time intervals between successive fiducial points 191-199 are indicated as time intervals 1 through 4. Subsequent breathing cycles are marked by the fiducial points 199-221.

A variety of techniques may be used to obtain the four fiducial points. The most successful approach uses zero crossings of the first derivative of the signal to define points 193, 197, 201, 205, 209, 213, 217 and 221, and threshold crossings of the signal to define points 191, 195, 199, 203, 207, 211, 215 and 219. Before detecting the thresholds, a DC baseline subtraction is first performed from an exponentially smoothed average value.

Prior to use as in real-time calculation of phase, the monitoring method is calibrated to the subject being measured by the acquisition of a few, for example 5 breaths. During these baseline breaths, the average time spent in each subinterval is measured and so a template of the respiratory pattern is built up. The respiratory phase range (e.g., zero to one) is then divided among the subintervals or segments in proportion to the relative temporal length of each segment. Thus, a starting and ending phase value is defined for each segment, and also a slope (change of phase per unit time) is determined for each segment.

This template is then used to calculate real-time phase values. Also, the template is updated and changed as necessary to compensate for changes in the subject's respiration. At any point in time, the current respiratory cycle segment is known since the most recently crossed fiducial mark can be remembered. The phase within each segment is calculated by $$\phi(t) = \phi_s + \left(\frac{d\phi}{dt}\right) t \tag{11}$$

subject to the constraint that $$\phi(t) \leq \phi_e \tag{12}$$

where $\phi_s$, $\phi_e$ and $d\phi/dt$ are the starting phase, ending phase and slope values for the present segment, and t is the time since the relevant fiducial mark was detected. The real time phase is not allowed to exceed $\phi_e$ until the next fiducial mark is observed. When this next fiducial mark is encountered, the time spent in the subinterval is calculated and used to update the average time value for that segment, for example by exponential averaging. At the end of each breath, the phase range is re-apportioned to the subintervals and new values of $\phi_s$, $\phi_e$ and $d\phi/dt$ are calculated for each subinterval.

This first approach is reasonably successful; but abrupt changes in the breathing pattern often cause a fiducial point to be missed with resulting errors in phase.

In the second alternative approach, the output phase is defined as the phase of a sine wave with a period equal to the average breathing period that best matches the immediately preceeding data. In this second approach, a baseline acquisition of a few breaths is used to estimate the respiratory period. Any one of several markers, for example an upward threshold crossing, can be used to define the end of a cycle. Further, as respiration transducer data is acquired it is placed in a circular buffer so that, at all times, data for some period of time immediately preceeding the present is available.

After the baseline period is completed, respiratory phase values are calculated by calculating the phase of the sine wave with a period equal to the respiration period that best matches the immediately preceeding data. This can be calculated, for example, by correlating the preceeding date with one cycle of a sine wave and one cycle of a cosine wave of the known period and taking the inverse tangent of the ratio.

As respiration phase values are being calculated, end of cycle markers are also found and used to update a running estimate of the respiration period. This algorithm has the advantage of simplicity and robustness, although it can be fooled momentarily by a sudden change in the breathing rate.

Recognizing a few fiducial points such as points 191-221 in the waveform 190 of FIG. 18 may provide a basis for mapping the phase of the signal y(t) over a full cycle, but it does not react quickly to changes in the respiration pattern. This is at least in part due to the fact that there is more information contained in the respiration waveform than is extracted by detection of only one or a few fiducial points. Further, the points labeled 199 and 203 represent similar object orientations even though these points are on opposite sides of peak inspiration 201 and this information can be used, as described in the aforementioned application, to further improve artifact suppression.

Figure 19:
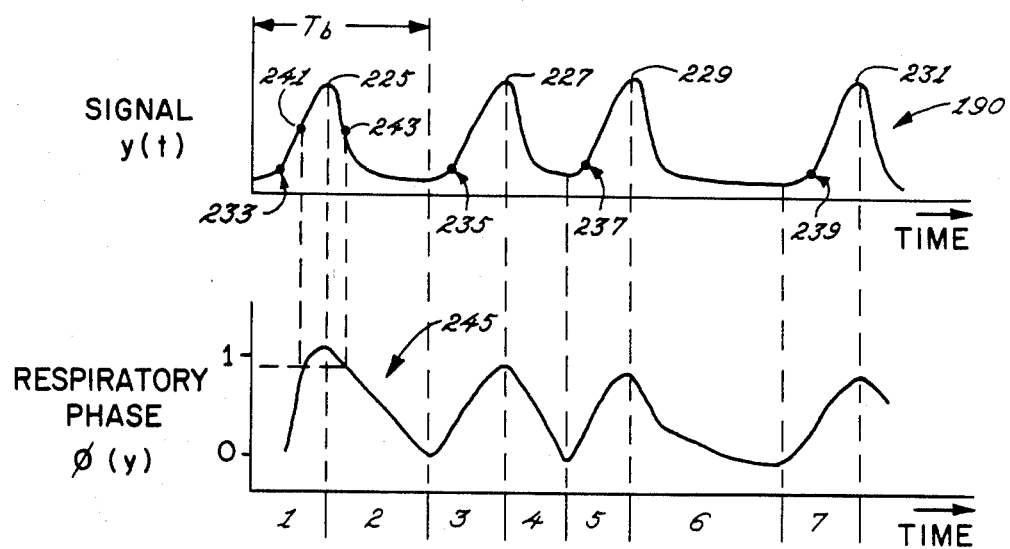
FIG. 19 illustrates plots as a function of time of a representative respiratory waveform (the same as shown in FIG. 18) and a representative corresponding phase signal according to a second, preferred alternative embodiment of the invention.

After development of the first and second alternative approaches, applicants recognized that the use of a normalized breathing amplitude instead of breathing phase would be a more accurate indicator of the respiration state of a subject to be imaged. The conceptual difference is shown in FIG. 19. With the amplitude approach illustrated in FIG. 19, the output "phase" depends only on a normalized measure of the signal amplitude and thus points of equal amplitude during inhalation and exhalation are assigned equal values of phase.

In keeping with the invention, the respiratory signal y(t) preferably is normalized with respect to its distribution of amplitude values. This is done by calculating a transformation $\phi(y)$ from measured signal (y) to phase ($\phi$). For each measured signal y(t), then, the output phase is:

$$\phi(t) = \phi(y(t)) \tag{13}$$

The signal $\phi(t)$ produced by this method is referred to as a "phase" even though it is not in the strictest sense a measure of the phase of the signal y(t).

Figure 20:
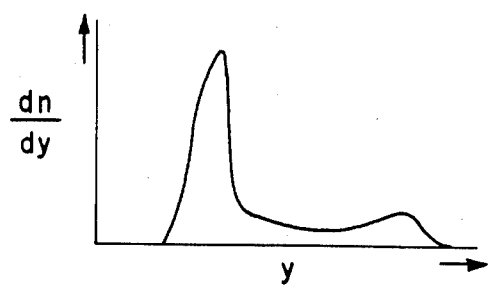
FIG. 20 illustrates a frequency histogram for the respiratory waveform of FIGS. 18 and 19.

In order to determine the phase transfer function $\phi(y)$ according to the third, alternative approach of the invention, let y(t), wherein $-T \leq t \leq 0$, be a set of measurements of the respiratory signal as a function of time over the previous T seconds. Further, let h(y)=dN(y)/dy be the probability density function or frequency histogram for y(t), i.e., dN/dy is the number of occurrences of the signal with amplitudes between y and y+dy. The frequency histogram for the respiratory signal 190 (FIGS. 18 and 19) is shown in FIG. 20. The non-uniform nature of the histogram of y(t) is easily seen. But, these non-uniform and not-equally-likely respiratory signals must be mapped to equally likely phase signals; for example, a monotonic range of values from 0 to 1 for the previously described artifact suppression method to work. The desired phase transfer function $\phi(y)$ is given by $$\phi(y) = \frac{1}{N_o} \int_{-\infty}^{y} h(y')dy', \quad (14)$$

where $N_o$ is a normalization $$N_o = \int_{-\infty}^{\infty} h(y')dy'. \quad (15)$$

The probability density $dN/d\phi$ for the values of phase $\phi(y)$ as defined by Equation (14) is uniform, as desired, when the input is $y(t)$. Therefore, the foregoing method provides a phase signal wherein all output values are equally likely so that all of the phase encoding amplitudes are equally likely, and the views in a scan are assigned in a nearly optimal way. Application of the chain rule provides proof of this uniformity:

$$\frac{dN}{d\phi} = \frac{dN}{dy} \cdot \frac{dy}{d\phi}, \quad (16)$$

$$= \frac{dN}{dy} / \frac{d\phi}{dy}$$

From Equation (14), and the definition of h:

$$d\phi/dy = \frac{1}{N_o} \cdot \frac{dN}{dy}, \quad (17)$$

Thus, from Equation (13) and (14), $$\frac{dN}{d\phi} = \frac{dN}{dy} / \left\{ \frac{1}{N_o} \cdot \frac{dN}{dy} \right\}, \quad (18)$$

$$= N_o$$

which is indeed a constant. Thus $\phi(y)$ satisfies the requirement that when the input signal is accurately described by the histogram of the preceding interval, the histogram of the output measure $\phi = \phi(y)$ will span the phase interval (0 to 1) with uniform frequency density.

An intuitive appreciation of the present embodiment can be obtained by examination of Equation (14). The integral is equal to the number of readings in the histogram h with signal values less than y and $N_o$ is equal to the total number of readings in the histogram. The ratio, then, is equal to the fraction of readings with values less than y.

Consider the breath starting at point 233 in FIG. 19. Since at point 233 the reading y is very low, a very small phase value will be computed due to the fact that few readings in the histogram will have a value less than that at 233. As the signal increases from 233 to 225 the calculated phase will increase. Since the reading at 225 is very close to the highest in the histogram, the calculated phase will be nearly 1.0. As the measured signal decreases in the interval following 225 the calculated phase will decrease also. Thus, the calculated phase is monotonically related to the measured respiration signal.

The relationship between phase and input signal is non-linear however. In particular, in the neighborhood of signal levels that are very likely (i.e., y values where h(y) is large) small changes in signal level will produce larger changes in phase than they would in the neighborhood of signal readings that are not very likely. This is especially noticeable in the signal plateau at end expiration (e.g., just before point 235 in FIG. 19) where we see large changes in phase resulting from small changes in signal. Again, this results from the fact that at these signal levels the integral in Equation (14) changes substantially with small changes in signal. It is this property—the fact that the change in phase due to a change in signal depends on the distribution of signal values—that produces a phase distribution where all phases are equally likely.

Because not all breaths are of equal length, a shorter-than-average breath, such as the one between points 235 and 237, may be observed. It can be appreciated that the present method will track such changes quickly since it is using the measured signal values in real time. Thus, if the respiration signal decreases more rapidly during the shorter breath, so will the phase output $\phi(t)$. If the measured signal begins to increase due to the onset of a new breath, so will the calculated phase. Some breaths, such as the one depicted by the signal y(t) between points 237 and 239, may be longer than expected. In these cases, the value of the "phase" signal $\phi(t)$ may reach 0 before the next breath occurs as indicated in time interval 6 of the waveform 245.

As was discussed above, the patient's respiration pattern may change during the examination and so it is important to insure that the phase calculation method can adjust to such changes. This is easily incorporated in the present embodiment by updating, as necessary, the respiration signal histogram h(y). Essentially, the current value of the respiration signal is compared to the data measured during some period immediately preceeding the reading. It has been found that better performance is obtained if the period of time consists of an integer number of breaths, for example three or four breaths, since then no bias is introduced into the histogram.

In keeping with the invention, the foregoing method may be converted to a discrete implementation for use by the processor 188 in FIG. 17. For discrete values comprising y(t) that are acquired by the A/D converter 186 from the analog signal (190 of FIGS. 18 and 19) produced by the respiratory transducer 182 in FIG. 17, Equation (14) may be rewritten as $$\phi(y) = \phi(t) = (N_L + \tfrac{1}{2} N_E)/N_T, \quad (19)$$

where $N_T$ is the total number of readings by the A/D converter 186 in T seconds, while $N_L$ is the number of readings in the previous T seconds whose amplitude is less than a predetermined amplitude Y and $N_E$ is the number of readings in the previous T seconds whose amplitude is equal to Y. With this discrete approach, the histogram h(y) is never really generated. Instead, only the required point in the integral histogram h(y) is generated when it is needed to find the present value of $\phi(t)$. Because the histogram need not be constructed or reconstructed after every sample of y(t), the implementation of the method of the invention is not overly demanding on the processor 188.

In order to execute the discrete implementation of the invention as expressed in Equation (19) some number, for example, 1000 samples of the respiration waveform (190 in FIGS. 18 and 19) are acquired by the A/D converter 186 and stored in a buffer within the processor 188. From this established base, for every subsequent sample y(t), a phase value $\phi(t)$ may be determined. Specifically, a new sample y(t) is acquired, stored in the data buffer and the oldest sample in the buffer is discarded. The value of the new sample y(t) is compared with the previously stored samples, $N_L$ and $N_E$ are calculated from the comparison, and the value of the phase $\phi(t)$ for the new value of y(t) is computed using Equation (19). The probability distribution function is, in effect, continually updated so that changes in the respiration pattern during the scan are accommodated.

Before the processor 188 initiates execution of the method of the invention, an estimate of the respiratory period $T_b$ (in FIG. 19) must be made in order for the total number of readings $N_T$ to be gathered over an approximate whole respiratory cycle or a multiple thereof. Because the oldest sample is discarded when a new sample is acquired, it is important that the oldest and newest sample are from similar points in the respiratory cycle; otherwise, the histogram of the function of y(t) is distorted. Therefore, the time interval T during which samples of y(t) are gathered is expressed as, $$T = FT_b, \quad (20)$$

where F is an integer. The total number of samples $N_T$ is determined by the sample period of the A/D converter 186 and may be expressed as, $$N_T = T/\Delta t, \quad (21)$$

where $\Delta t$ is the sample period of the A/D converter 186.

In order to provide for changes in the respiratory cycle $T_b$, the processor 188 employs a threshold detector to measure the time period of each cycle. A change in the measured value $T_b$ results in a new value for the sample time interval T (Equation 17) and a new total number of samples $N_T$ (Equation 18).

An alternative discrete implementation is to use a discrete histogram. Suppose at time t the reading $y_j$ is measured and h(i) is equal to the number of readings in the previous T seconds with value $y_i$. Equation (14) then becomes $$\phi(t) = \frac{\sum_{i=1}^{j=1} h(i) + \frac{1}{2}h(j)}{N_T} \quad (22)$$

where we have assumed that $y_1 < y_2 < y_3$, etc. After each sample is acquired and a phase output is calculated, the histogram is updated by removing the oldest reading (the one that is T seconds old) from it and adding the newest reading. Further, the histogram must be updated if the period T is changed.

It will be clear to those skilled in the art that Equation (14), (19) and (22) could be modified so as to produce large phase signals during low values of the respiration signals and vice versa. For example, Equation (14) would become $$\phi(t) = \frac{1}{N_o} \int_y^\infty h(y')dy' \quad (23)$$

In this case, $\phi(t)$ is the function of readings that are greater than y(t). Clearly the phase produced by Equation (23) is equal to one minus that produced by Equation (14). The resulting phase outputs would be negatively correlated to the respiration signals but would still be approximately evenly distributed and still be advantageously used in conjunction with the artifact reduction method.

Preferably, the A/D converter 186 has a sufficient range so that subtraction of the DC baseline from the analog signal y(t) is unnecessary. Also, in order for the processor 188 to achieve the best execution of the method, the precision of the A/D converter 186 should be high enough to provide sufficient detail about the respiration signal. A ten bit resolution has been found adequate to both accommodate the DC baseline in y(t) and provide sufficient precision.

The present embodiment as just described produces substantially the same calculated phase value for input signals such as 241 and 243 in FIG. 19. This is appropriate, and in fact preferred, if the object appearance is the same at these two points and if there is minimal lag between when the phase is calculated and when it is actually used by the Pulse Control Module 112. If either of these assumptions is violated poorer results will be obtained since different object orientations will be treated similarly.

Thus, in some applications, it may be preferable to not similarly treat all points with the same signal level, such as 241 and 243. The present method can easily be modified to accommodate such a requirement. This could be done, for example, by separating the respiration cycle into two portions: inspiration (e.g., time segments 1, 3, 5, and 7 in FIG. 19) and expiration. Decisions about which cycle portion one is in are made using fiducial marks such as signal maxima and minima. For each cycle portion separate histograms are acquired and maintained. Suppose $N_I$ samples were acquired in inspiration in the previous T seconds, $N_E$ samples were acquired in expiration, and $N_T = N_I + N_E$. Further, let $h_I(y)$ and $h_E(y)$ be the inspiration and expiration histograms, respectively. Then for a signal y(t) during inspiration $$\phi(t) = \frac{1}{N_T} \int_{-\infty}^y h_I(y')dy' \quad (24)$$

while for a signal during expiration $$\phi(t) = \frac{1}{N_T}\left(N_I + \int_{-\infty}^\infty h_E(y')dy'\right) \quad (25)$$

From the foregoing, it can be appreciated that the invention provides an apparatus and method responsive to a periodic signal for deriving another periodic signal whose values are all equally likely. The equally-likely phase signal is preferably used in connection with optimizing the view order as disclosed in U.S. Pat. No. 4,663,591. But, it will be appreciated that the invention is generally applicable to any purpose that requires the transformation of a periodic signal whose values are not all equally likely to a signal characterized by values that are all equally likely.

For example, the present respiration monitor can be used with another magnetic resonance imaging method, commonly referred to as respiratory gating. In this technique, imaging data are acquired only during a portion of the respiration cycle, typically end expiration, in order to reduce the amount of motion contained in the imaging data. For this purpose, one prior art method applies a threshold detector to the signal output of a respiration transducer such as a pneumatic bellows. When the respiration signal is below the threshold, a gate is turned on and data collection is enabled.

It is clear, however, that from subject to subject the fraction of the time that data collection is enabled will vary. Further, this fraction can also vary as the respiration pattern changes.

The present invention can advantageously be used for respiration gating. For example, the operator can select that data be acquired when the respiratory phase is between 0.0 and 0.3. Then, independent of the details of the shape of the waveform or variations in this shape, data collection will be enabled for approximately 30% of the time. As a result, the examination time can be more accurately predicted.

It will also be obvious to those skilled in the art of medical imaging that the present method can be used in conjunction with other imaging modalities. For example, the respiration phase signal can be used to control data collection in nuclear medicine scintigraphy or in ultrasonography.

We claim:

1. A method for generating from a signal y(t) related to a substantially cyclic phenomenon a signal $\phi(t)$ whose values are substantially equally likely for use in a system to correlate events to said cyclic phenomenon, said method comprising the steps of:
   (a) establishing a historical data base derived from values of the signal y(t) for a period of time preceding the present time;
   (b) measuring parameters related to the present value of the signal y(t); and
   (c) producing a value for $\phi(t)$ using the present measured parameters and the historical data base; wherein the values of $\phi(t)$ are more evenly distributed than the values of y(t).

2. The method of claim 1 wherein said events are imaging events, said cyclic phenomenon creates artifacts in a desired image of an object and said method includes the step of:
   (d) executing an imaging event in response to the present value of said signal $\phi(t)$ in accordance with a predetermined relationship between $\phi(t)$ and said sequence of events so as to distribute said imaging events over said cyclic phenomenon in a manner to minimize artifacts.

3. The method of claim 1 wherein said step of establishing an historical data base includes detecting at least one fiducial mark in the signal y(t) and measuring the relative timing of the occurrence of said at least one fiducial mark; wherein said step of measuring parameters includes detecting the occurrence of said at least one fiducial mark and measuring the elapsed time since the most recent fiducial mark; and wherein said step of producing a value uses said measured elapsed time.

4. The method of claim 1 wherein said step of establishing a historical data base includes estimating the period of the signal variations; and wherein said step of producing a value for $\phi(t)$ includes estimating the present phase of a sine wave whose period is approximately equal to the estimated period of the signal variations and which is the least square fit to the y(t) data for some period preceding the present time.

5. The method of claim 1 wherein said step of producing a value for $\phi(t)$ includes comparing the value of the present y(t) measurement to the historical data base.

6. The method of claim 5 wherein said step of measuring parameters relating to the present value of the signal y(t) consists of measuring the magnitude of said signal and said step of comparing consists of estimating the fraction of the readings of y(t) in the historical data base whose magnitudes are no larger than the present value of y(t).

7. The method of claim 5 wherein said step of measuring parameters relating to the present value of the signal y(t) consists of measuring the magnitude of said signal and said step of comparing consists of estimating the fraction of the readings of y(t) in the historical data base whose magnitudes are no smaller than the present value of y(t).

8. An apparatus for controlling the distribution of imaging events with respect to a cyclic phenomenon of an object to be imaged wherein a signal y(t) is indicative of said cyclic phenomenon and has values that are not all equally likely in a given cycle, said apparatus comprising:
   (1) means for sensing said cyclic phenomenon and generating said signal y(t) indicative of said phenomenon;
   (2) means for collecting at least a portion of said values of said signal y(t) and storing said values so as to provide a historical data base;
   (3) means for measuring at least one parameter of said collected values of y(t);
   (4) means responsive to the present value of said at least one parameter of y(t) and said historical data base so as to provide a signal $\phi(t)$ whose values are more evenly distributed than the values of y(t); and
   (5) means responsive to the present value of $\phi(t)$ for timing and ordering execution of said imaging events with respect to said cyclic variation so as to minimize artifacts in an image derived from said imaging events wherein said artifacts are caused by said cyclic variation.

9. The apparatus of claim 8 wherein said means (2) includes means for detecting the occurrence of at least one fiducial mark in the signal y(t) and means (3) includes means for measuring the relative timing of the occurrence of said at least one fiducial mark.

10. The apparatus of claim 8 including:
    (5) means responsive to means (2) for estimating the period of said signal y(t); and
    (6) means responsive to means (5) for estimating the present phase of the signal y(t) by determining the present phase of a sine wave whose period approximately equals the period of said signal y(t).

11. The apparatus of claim 10 wherein said means (5) estimates the period of said signal y(t) by finding the sine wave that is the least square fit of the values in said historical data base.

12. The apparatus of claim 8 wherein means (4) includes means for comparing the value of the present value for y(t) and the values of the historical data base.

13. The apparatus of claim 12 wherein means (4) estimates a present value of $\phi(t)$ by determining the fraction of the values y(t) incorporated in said historical data base whose values are not greater than the present value of y(t).

14. The apparatus of claim 12 wherein means (4) estimates a present value of $\phi(t)$ by determining the fraction of the values y(t) incorporated in said historical data base whose values are not greater than the present value of y(t).

15. The apparatus of claim 12 wherein the data gathered by means (2) are discrete measurements of the amplitude of the signal y(t) and means (4) determines a present value of $\phi(t)$ which is given by $$(N_L + \tfrac{1}{2}N_E)/N_T$$

where $N_L$ is the number of stored data less than the most recent value of y(t), $N_E$ is the number of stored data equal to the most recent value and $N_T$ is the total value of stored data.

16. The apparatus of claim 15 wherein means (3) defines a predetermined number $N_T$ of discrete measurements of the amplitude of the signal y(t) collected by means (2) such that the total time interval which the data represents is equivalent to an integer multiple of the period of the signal y(t).

17. The apparatus of claim 16 including means (6) for sensing the period of the signal $\phi(t)$ and responding to changes in the period by causing means (3) to change the total number $N_T$ of discrete measurements such that the total number $N_T$ multiplied by the time interval between samples approximates an integer multiple of the period of the signal y(t).

18. In a system for reducing artifacts in a desired image due to substantially periodic signal variations occurring in a portion of an object being examined using nuclear magnetic resonance techniques, which techniques include measurement of imaging data about the object portion through the implementation of a plurality of views, wherein each view includes a pulsed magnetic field gradient applied along at least one dimensional axis of the object and the gradient has a parameter value adjustable to a different value in each view so as to encode spatial information into the NMR signal, a method for generating from a signal y(t) whose values are not equally likely a signal $\phi(t)$ whose values are substantially equally likely, said method comprising the steps of:

(a) selecting a predetermined relationship between the signal variations and the parameter value of said magnetic field gradient, wherein selection of said relationship defines a correspondence between a desired parameter value to be implemented in a given pulse sequence and the phase of said signal variations;

(b) generating a signal y(t) indicative of the substantially periodic signal variations;

(c) establishing a historical data base of the signal y(t);

(d) establishing $\phi(t)$ by approximating an equalized and normalized histogram of y(t) from the data base;

(e) measuring the present value of y(t);

(f) providing a present value of $\phi(t)$ in response to measurement of the present value y(t);

(g) selecting a parameter value for said magnetic field gradient using the present value of $\phi(t)$ in accordance with said predetermined relationship;

(h) executing a pulse sequence using the selected parameter value to produce an NMR signal; and (i) repeating steps (e) through (h) until view data for a complete scan has been collected.

19. The method of claim 18 wherein the present value of $\phi(t)$ is provided by comparing the historical data base with the present value of y(t).

20. The method of claim 18 wherein $$\phi(t) = (N_L + \tfrac{1}{2}N_E)/N_T$$

where $N_L$ is the number of data in the data base whose amplitudes are less than the amplitude of the present signal y(t), $N_E$ is the number of data in the data base whose amplitudes are equal to the amplitude of the present signal y(t) and $N_T$ is the total number of data in the data base.

* * * * *